United States Patent [19]

Bachmann

[11] 4,291,323
[45] Sep. 22, 1981

[54] INDIUM PHOSPHIDE ARSENIDE BASED DEVICES

[75] Inventor: Klaus J. Bachmann, Piscataway, N.J.

[73] Assignee: Bell Telephone Laboratories, Incorporated, Murray Hill, N.J.

[21] Appl. No.: 145,610

[22] Filed: May 1, 1980

[51] Int. Cl.³ .................... H01L 31/00; H01L 31/06
[52] U.S. Cl. .................................... 357/30; 136/252; 136/262; 250/211 J; 250/212; 357/65; 357/67
[58] Field of Search ........ 136/89 CR, 89 GA, 89 SG, 136/252, 262; 357/30, 67, 65; 250/211 J, 212

[56] References Cited

U.S. PATENT DOCUMENTS 4,121,238  10/1978  Bachmann et al. .................. 357/16

OTHER PUBLICATIONS

J. J. Tietjen et al., "The Preparation & Properties of Vapor Deposited Epitaxial $InAs_{1-x}P_x$ Using Arsine & Phosphorous;" *J. Electrochem. Soc.*, vol. 116, pp. 492–494 (1967).

H. A. Allen et al., "Deposition of Epitaxial $InAs_xP_{1-x}$ on GaAs & GaP Substrates", *J. Electrochem. Soc.*, vol. 17, pp. 1081–1082 (1970).

H. A. Allen, "The Orientation Dependence of Epitaxial $InAs_xP_{1-x}$ on GaAs", *J. Electrochem. Soc.*, vol. 117, pp. 1417–1419 (1970).

p-InP/n-CdS Solar Cells & Photovoltaic Detectors", *Appl. Phys. Lett.*, vol. 26, pp. 229–230 (1975).

*Primary Examiner*—Aaron Weisstuch
*Attorney, Agent, or Firm*—Bruce S. Schneider

[57]  ABSTRACT

Devices based on $InAs_{1-x}P_x$ where $0.85 \leq x < 1$ show advantageous properties. An exemplary device is a rectifying diode formed from indium tin oxide deposited on the subject $InAs_{1-x}P_x$.

4 Claims, 4 Drawing Figures

INDIUM PHOSPHIDE ARSENIDE BASED DEVICES

BACKGROUND OF THE INVENTION

1. Field of the Invention

This invention relates to semiconductor devices and, more particularly, to semiconductor devices responsive to electromagnetic radiation.

2. Art Background

A significant measure of the usefulness of a system employing opto-electronic devices (photodetectors) or photovoltaic devices (solar cells) is the efficiency of the system. Indeed, even small increases of the efficiency in optical communications systems (opto-electronic device system) or in solar energy systems (photovoltaic device systems) are extremely important. The primary method for increasing efficiency in such systems is by decreasing scattering loss in the optical fibers of the opto-electronic system or by increasing the solar conversion efficiency in the photovoltaic system. Various schemes are utilized to achieve increased efficiency through these methods. For example, in the case of opto-electronic systems, scattering in the glass fiber is reduced by employing longer wavelength radiation. In this regard, optical communication devices that detect light at 1.05 and 1.3 $\mu$m have been fabricated using semiconductor materials with appropriate bandgaps. Similarly, the efficiency of solar energy systems has been improved by an appropriate choice of constituent semiconductor materials having a desirable bandgap—the bandgap strongly influences the developed current and voltage, and thus, the solar conversion efficiency.

Because the bandgap of ternary semiconductor alloy materials is controlled by adjusting their composition, these complex semiconductor materials are used in various opto-electronic and photovoltaic devices to achieve the goal of increased efficiency. (See C. J. Nuese, *Journal of Electronic Materials*, 6, 253 (1977) and R. L. Moon, L. W. James, H. A. VanderPlas, T. O. Yep, G. A. Antypas, and Y. Chai, *Conference Records* 13th *IEEE Photovoltaic Specialist Conference*, Washington, D. C. 1978, respectively, for exemplary opto-electronic and photovoltaic devices using ternary semiconductor alloy material.) Generally, the best composition of a ternary alloy material for a given application can be determined without extensive experimentation. Once an efficiency for a device using a ternary semiconductor material of one composition having a given energy gap is measured, reliable theoretical prediction of the efficiencies obtained with the same ternary having a different composition and concomitant energy gap usually is made. (See J. J. Loferski, *Journal of Applied Physics*, 27, 777 (1956).) In this manner the composition yielding the best efficiency is generally determined by fabricating only one or two devices with different compositions. Similarly, from the bandgap and photo response measured for a ternary used in an opto-electronic device, the photo response for other composition of the same ternary system is reliably predicted. Despite this situation, the number of photovoltaic device having efficiencies of at least 15 percent is quite limited and there exists only a very limited number of opto-electronic devices which respond to wavelengths in the near to intermediate infrared, i.e., wavelengths beyond 1.65 $\mu$m.

SUMMARY OF THE INVENTION

The use of $InAs_{1-x}P_x$ where $0.85 \leq x < 1$ produces advantageous opto-electronic and photovoltaic devices. Exemplary of such devices is a photovoltaic device produced by interfacing indium tin oxide or indium oxide and $InAs_{1-x}P_x$ ($0.85 \leq x < 1$). Surprisingly, using the particular composition specified, an efficiency significantly above that expected from theoretical predictions based on experimental measurement for InP/indium tin oxide diodes, is possible.

The use of opto-electronic devices having an $InAs_{1-x}P_x/In_yGa_{1-y}As$ interface ($0.85 \leq x < 1$) produces devices useful at wavelengths longer than 1.65 $\mu$m. Exemplary of these devices is a heterojunction between $InAs_{1-x}P_x$ and $In_yGa_{1-y}As$ or an $In_yGa_{1-y}As$ homojunction built on an $InAs_{1-x}P_x$ substrate.

DETAILED DESCRIPTION

Figure 1:
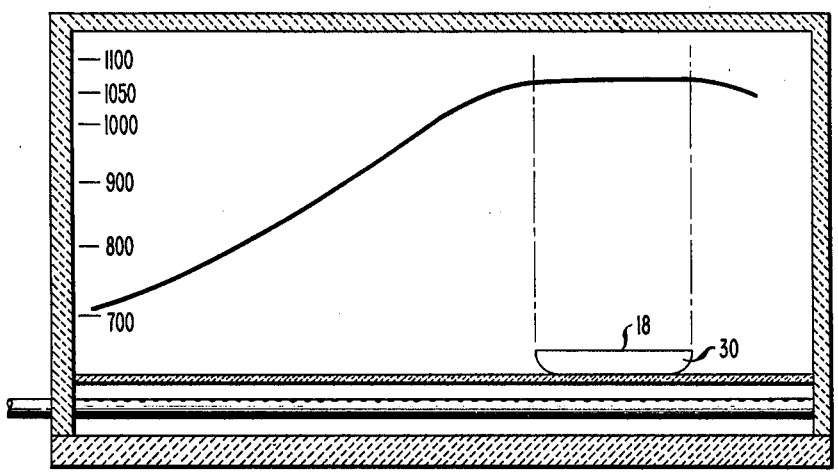
FIGS. 1 and 2 represent equipment useful in the fabrication of the subject devices.

The devices of the subject invention employ the material $InAs_{1-x}P_x$ where $0.85 \leq x < 1$. (For convenience this specific range of compositions for indium gallium arsenide will be referred to as "the phosphide" in the remainder of this disclosure.) The phosphide of the subject invention is produced by conventional techniques such as zone leveling or Liquid Encapsulated Czochralski (LEC) pulling. The method of producing such material by zone leveling is substantially as described in copending application, Ser. No. 73,206, filed Sept. 7, 1979, by K. J. Bachmann and C. T. Ryan, which is hereby incorporated by reference. Briefly, the method first involves producing the phosphide by a gradient freeze technique. An appropriate furnace configuration and temperature profile is shown in FIG. 1. An inert boat, 30, is positioned as shown in FIG. 1 and a mixture of InAs and InP, 18, is placed in the boat. The boat with its contents is then sealed in an evacuated fused silica ampule. (For clarity the ampule is not shown in FIG. 1.) Additionally, elemental phosphorus and elemental arsenic are added inside the capsule, but outside the boat, to insure that the atmosphere within the reaction chamber has a reserve of these elements. The excess of phoshorous and arsenic over the desired compound proportions depends on the size of the reaction vessel and composition, but generally should be in a quantity at nominal processing temperatures to produce less than 0.15 atms., $As_2$ vapor, and at least 18 atms. $P_4$ vapor.

The amount of InP and InAs used in the boat should be in the proportion dictated by the stoichiometry of the compound desired. For the purpose of subsequent zone leveling the average composition of the synthesized material is chosen substantially to match the desired crystal composition. The boat with its InP and InAs along with the elemental phosphorus and arsenic are heated to $\sim 1065$ degrees C. This heating process must be carefully done to avoid an explosion. Generally, a heating period of a number of days, e.g., 1 to 3 days, is required for safety purposes. For example, heating within 1-2 hours to 500 degrees C. followed by a linear increase at a rate of $\sim 20$ degrees per hour is appropriate. Alternatively, it is possible to synthesize the alloy from elemental P, As and In metal. In this case, the danger of explosions is higher than if InAs and InP is used and longer heating times of, for example, 3-12 days are recommended.

The melt is maintained at the chosen temperature for a sufficiently long time to insure homogeneity of the liquid body. This period is generally from 1 to 12 hours. The melt is then cooled to a temperarture at which the entire reaction mass has solidifed. The time period for cooling from the belt condition to the solid condition is not critical since the material will be remelted in the subsequent zone leveling step. However, since rapid directional solidification in conjunction with the expansion of the material upon freezing could lead to spillage causing explosions, it is desirable to decrease the temperature for periods from 2 to 7 days to a final temperature of 400 degrees C. before heating is totally terminated.

The crystal is doped by substituting sufficient doped InP into the initial reaction mixture to produce the desired majority carrier concentration in the final crystal. (Doping could be introduced using doped InAs, but since the InP melts after the InAs, the previous method mitigates the amount of dopant lost through evaporation.) For example, if p-type doping is desired, a portion of zinc or cadmium doped InP is utilized and if n-type doping is required a Sn doped portion is employed. The amount of dopant, and thus the carrier concentration used, varies with the ultimate application. However, for most purposes, majority carrier concentrations in the bulk crystal in the range $10^{15} cm^{-3}$ to $10^{19} cm^{-3}$ are suitable.

The polycrystalline charge obtained by the gradient freeze method is broken into pieces, 11, (FIG. 2) and placed in an inert boat, 10, for zone leveling. When a crystal of average composition $InAs_{1-x}P_x$ is to be processed, a piece of average composition $x/k_e$ (where $k_e$ is the effective distributive coefficient and is obtainable from experimental phase relation data, (e.g., A. G. Thompson and J. W. Wagner, *Journal of Physics and Chemistry of Solids*, 32, 2613 (1971)), is placed at the end of the boat adjoining the broken phosphide. (See W. G. Pfann, *Zone Melting*, 2nd Ed. Wiley (1966).) Alternatively, without using a piece of composition $x/k_e$, the desired result is obtained by employing an even number of zone passes during zone leveling with a direction reversal after each pass.

Figure 2:
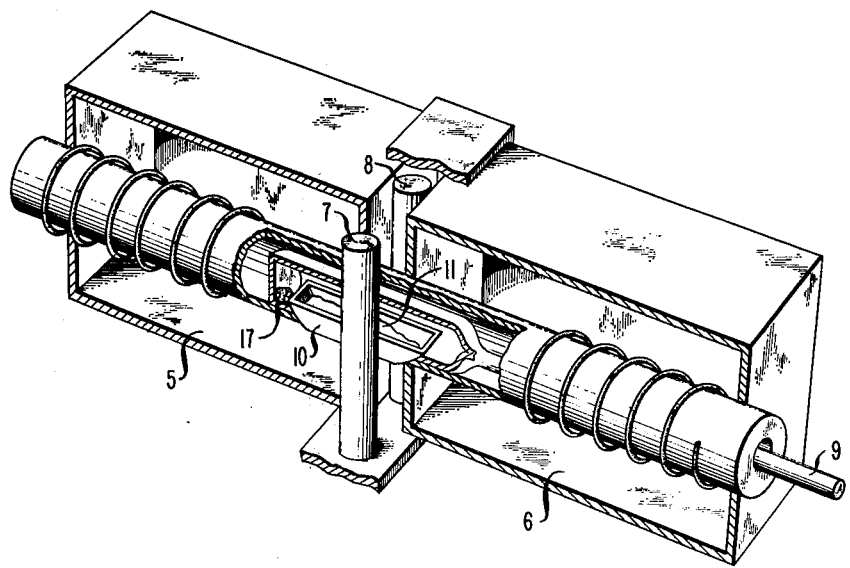

The boat is sealed in an evacuated ampule. Before sealing, an excess of P and As, 17, is placed into the ampule. These elements are added to provide an $As_2$, $P_2$, and $P_4$ vapor atmosphere. The entire body is then placed in an apparatus as shown in FIG. 2 with the glow bars, 7 and 8, straddling the material having composition $x/k_e$. The furnaces, 5 and 6, are heated to a temperature below the melting point of the compounds in the boat. Both furnaces, 5 and 6, are used at the same temperature, usually 750 to 950 degrees C. However, if a solid P source which is to be vaporized is used to provide the $P_2$ and $P_4$ atmosphere, only one furnace, 6, in FIG. 2, is heated to about 750 to 950 degrees C., while the other is kept at about 500 to 550 degrees C. This latter temperature is also picked so that the excess phosphorus, 17, placed in the ampule slowly evaporates to maintain $P_2$ and $P_4$ in the vapor phase. The glow bars are initially heated to melt the section of composition $x/k_e$ and moved to successively melt regions at a rate of 5-25 mm/day. Generally, the glow bar temperatures are raised until the desired zone size, i.e., approximately 10 mm, is visually observed.

Alternatively, the phosphide is manufactured by LEC pulling. In this method the average composition of the charge differs from that of the resulting crystal. For a desired composition of $InP_xAs_{1-x}$ a melt composition $In/P_z/As_{1-z}$ is used where z is $x/k_e$. (For value of $k_e$ as a function of x see A. G. Thompson and J. W. Wagner, *J. Phys. Chem. Solids*, 32, 2613 (1971).) The desired initial melt composition is made up from weighed fragments of InAs and doped InP. The fragments are placed in a crucible and covered with $B_2O_3$. The crucible is then heated inside the LEC puller which is pressurized to ~500 psi with $N_2$ until the materials are completely melted and trapped gases are removed. The melt is then frozen, transferred into a new crucible, and is covered by a second dose of $B_2O_3$. (This $B_2O_3$ should be sufficient to completely cover the phosphide and to give a layer of $\lesssim 6$ mm in thickness.) It is advantageous to use BN crucibles since they are inert to $B_2O_3$ attack. However, these crucibles are unstable in phosphorous deficient melts. Therefore, fused silica crucibles are utilized where problems arise due to attack of BN by the melt. After pressurization in the LEC puller and remelting, a seed obtained from a previous zone leveling or LEC experiment is then introduced into the phosphide and a conventional LEC pulling procedure is employed. (See K. J. Bachmann, E. Buehler, J. L. Shay, and A. R. Strand, *Journal of Electronic Materials*, 4, 389 (1975), for a further description of such a conventional procedure.) The seed should have a lattice constant and thus composition which is within 1 percent of the lattice constant of the first-to-freeze solid. To obtain the best crystal, rotation rates of between 50 and 120 rpm should be utilized.

Figure 4:
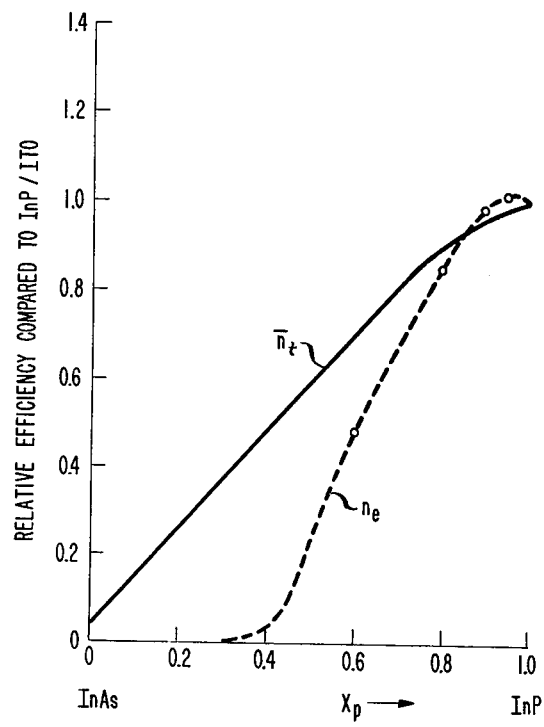

In one embodiment of the invention, rectifying junctions are produced by depositing a layer of indium tin oxide or indium oxide on the phosphide. The method of depositing the indium tin oxide or indium oxide is not critical provided low temperature processes are used. Typically, conventional sputtering techniques keeping the substrates at nominally room temperatures are utilized. For example, the indium tin oxide (ITO) or indium oxide, having a thickness in the range 500 Angstroms to 2 μm, preferably 2000 to 3000 Angstroms, is deposited onto the phosphide by sputter deposition. (The sputtering of indium tin oxide or indium oxide is a conventional technique and it is described in U.S. Pat. No. 4,121,238, issued Oct. 17, 1978, which is hereby incorporated by reference.) Contacts to the indium tin oxide or indium oxide are made by conventional techniques such as evaporation of Al, and contacts to the phosphide are similarly made by conventional techniques such as alloying with Au 2 percent Zn. Indium tin oxide/$InAs_{1-x}P_x$ diodes show an efficiency versus composition curve as illustrated in FIG. 4 by the dotted line denoted $n_e$. As can be seen, when this curve is compared to the expected efficiency (as indicated by the solid line marked $n_t$ predicted from efficiencies measured for InP/ITO diodes), the devices utilizing the phosphide in the subject compositional range exhibit unexpected advantageous efficiencies.

The use of indium gallium arsenide in conjunction with the phosphide also produces advantageous optoelectronic devices. In one embodiment, indium gallium arsenide is deposited on the phosphide using conventional liquid phase epitaxial techniques (LPE). The use of such techniques is well known and is adequately described in R. Sankaran, R. L. Moon and G. A. Antypas, *Journal of Crystal Growth*, 33, 271 (1976), T. P. Pearsall and R. W. Hopson, *Journal of Applied Physics*, 48, 4407 (1977), and K. J. Bachmann and J. L. Shay, *Applied Physics, Letters*, 32, 446 (1978). A heterojunction is produced between the n-type phosphide and the indium gallium arsenide by doping the indium gallium arsenide p-type using a conventional dopant such as Zn. Alternatively, a homojunction in the indium gallium arsenide is formed by first depositing p-type indium gallium arsenide onto the phosphide (p-type) by conventional techniques, e.g., LPE, and then depositing a second layer of n-type indium gallium arsenide on the p-type material, also by conventional techniques, such as LPE. (The above sequences of n- and p-type material deposition is reversible provided the majority carrier type of the phosphide is also reversed.) The composition of the indium gallium arsenide should be in the range $0.61 \geq y \geq 0.53$ so that a good lattice match to the phosphide is achieved and so that a bandgap in the range 0.68 to 0.75 eV corresponding to a composition in the range $y=0.61$ to $y=0.53$ is obtained. The resulting rectifying diodes yield a wavelength response up to approximately 1.85 $\mu$m. This affords the opportunity to use significantly longer wavelengths than previously employed in standard optical communication devices.

The following examples are illustrative of the processing parameters used to produce the subject devices:

EXAMPLE 1

Approximately 103 grams of a mixture of ZnP$_2$ doped indium phosphide and nominally undoped indium arsenide was placed in a pyrolytic boron nitride crucible. (The doping level of the mixture of InP and InAs was $\sim 4 \times 10^{17}$cm$^{-3}$.) The indium phosphide and indium arsenide were in molar proportions of 9 to 1. The indium phosphide/indium arsenide mixture was covered by 14.9 grams of B$_2$O$_3$. The crucible was loaded into a LEC (liquid encapsulated Czochralski) puller and heated under vacuum until the B$_2$O$_3$ melted. The pressure then was gradually allowed to increase by introducing nitrogen until a level of 500 psi was achieved. The temperature of the crucible was increased in approximately 2 hours using an rf generator to the melting point of indium phosphide, i.e., $\lesssim$1062 degrees C. The indium phosphide/arsenide melt was kept molten for approximately 4 hours and then the rf heating that produces the necessary heating was terminated. After cooling and depressurization, the InP$_{0.9}$As$_{0.1}$ slug was removed, etched using HCl, and dried. The slug was then reloaded into a pyrolytic boron nitride crucible and was covered with 11.6 grams of B$_2$O$_3$. The procedure described above was repeated except a nitrogen pressure of 530 psi and a 1 hour heating time was employed. A (111) indium phosphide seed (111-B face pointing downwards) was dipped through the liquid B$_2$O$_3$ to contact the InP$_{0.9}$As$_{0.1}$ melt. A crystal boule was pulled at the rate of approximately 0.35 inches per hour using a seed rotation rate of approximately 60 rpm.

Electron microscopic probe analysis indicated a solid composition of InP$_x$As$_{1-x}$ where $x > 0.95$. Hall measurements indicated a net acceptor concentration of approximately $1.7 \times 10^{17}$cm$^{-3}$. Additionally, a hole mobility of 72cm$^2$V$^{-1}$s$^{-1}$ at room temperature was observed by the Hall measurement. The boule was cut on the 111 plane and polished with Syton (a basic colloidal suspension of silicon dioxide particles).

Figure 3:
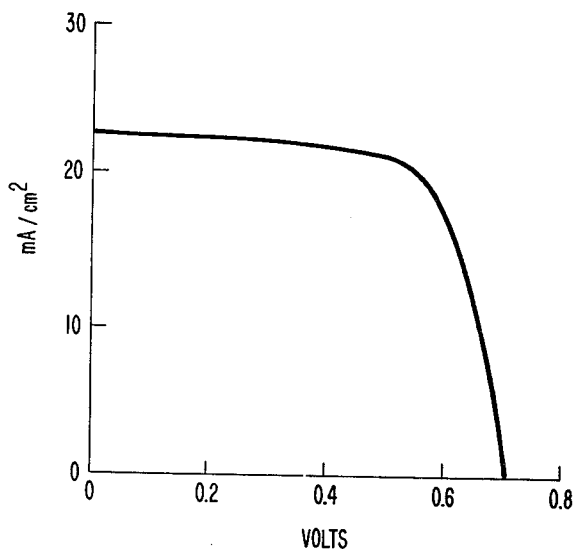
FIGS. 3 and 4 illustrate electrical properties of the subject devices.

A film of indium tin oxide (ITO) was deposited by rf sputtering as described in K. J. Backmann et al, *Journal of Applied Physics*, 50, 3441 (1979). All edges of the indium tin oxide coated phosphide were cleaved and a Au:Zn contact was made to the phosphide. A Au wire was contacted to the indium tin oxide using a GaIn alloy covered with silver paste. The cell efficiency was measured by the comparison method using simulated light having an air mass 2 (AM2) spectrum, (see P. Moon, *J. Franklin Institute*, 230, 583 (1940) for the characteristics of an AM2 spectrum), and using an ITO/InP solar cell standard as described in H. Brandhorst, J. Hickey, H. Curtis, and E. Ralph, *Interim Solar Cell Testing Procedures for Terrestrial Applications*, NASA TMX-71771, 1975.) The I-V characteristics obtained are shown in FIG. 3. A power of approximately 11 milliwatts/cm$^2$ corresponding to an experimental power conversion efficiency of approximately 15 percent was observed. Similar cells using different compositions of indium arsenide phosphide were produced and the results obtained as compared to the results achieved with and predicted from ITO/InP cells are shown in FIG. 4.

I claim:

1. A device comprising a region of a first semiconductor material comprising InAs$_{1-x}$P$_x$ in intimate contact with a region of a second material and means for applying a voltage to said first semiconductor material CHARACTERIZED IN THAT said first semiconductor material is InAs$_{1-x}$P$_x$ where $0.85 \leq x < 1$ and wherein said second material comprises a composition chosen from the group consisting of indium tin oxide and indium oxide whereby a rectifying junction is formed.

2. The device of claim 1 wherein said means for applying a voltage comprises a Au/Zn alloy contact.

3. A device comprising a region of a first semiconductor material comprising InAs$_{1-x}$P$_x$ in intimate contact with a region of a second material and means for applying a voltage to said first semiconductor material CHARACTERIZED IN THAT said first semiconductor material is InAs$_{1-x}$P$_x$ where $0.85 \leq x < 1$ and wherein said second material is In$_y$Ga$_{1-y}$As.

4. The device of claim 3 wherein said means for applying voltage comprises a Au/Zn alloy contact.

* * * * *

UNITED STATES PATENT AND TRADEMARK OFFICE
CERTIFICATE OF CORRECTION

PATENT NO. : 4,291,323

DATED : September 22, 1981

INVENTOR(S) : Klaus J. Bachmann

It is certified that error appears in the above—identified patent and that said Letters Patent is hereby corrected as shown below:

Column 3, line 10, "belt" should read --melt--. Column 4, line 58, "$n_t$" should read --$\overline{n}_t$--.

Signed and Sealed this

Ninth Day of February 1982

[SEAL]

Attest:

GERALD J. MOSSINGHOFF

Attesting Officer     Commissioner of Patents and Trademarks